US006566983B2

(12) United States Patent
Shin

(10) Patent No.: US 6,566,983 B2
(45) Date of Patent: May 20, 2003

(54) SAW FILTER USING A CARBON NANOTUBE AND METHOD FOR MANUFACTURING THE SAME

(75) Inventor: Jin Koog Shin, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/942,637

(22) Filed: Aug. 31, 2001

(65) Prior Publication Data

US 2002/0027485 A1 Mar. 7, 2002

(30) Foreign Application Priority Data

Sep. 2, 2000 (KR) ........................................ 2000-51783
Nov. 16, 2000 (KR) ........................................ 2000-68079

(51) Int. Cl.[7] .............................. H03H 9/64; H03H 3/08
(52) U.S. Cl. .................... 333/193; 310/313 R; 29/25.35
(58) Field of Search ................................. 333/193–196; 310/313 R, 313 B; 29/25.35

(56) References Cited

U.S. PATENT DOCUMENTS 5,855,998 A * 1/1999 Tanabe et al. .............. 428/216

6,419,848 B1 * 7/2002 Qiu et al. ............... 252/62.9 R

OTHER PUBLICATIONS

G.D. Mansfeld et al., "Acoustic And Acoustoelectron Properties of Carbon Nanotube Films", *2000 IEEE Ultrasonics Symposium*; vol. 1, pp. 581–584, Oct. 22–25, 2000.*

G.D. Mansfeld et al., "Microwave HBAR Spectroscopy And Transducer Application of Carbon Nanotube Films", *Proceedings, 1999 IEEE Ultrasonics Symposium*; vol. 1, pp. 561–564, Oct 17–20, 1999.*

* cited by examiner

*Primary Examiner*—Barbara Summons
(74) *Attorney, Agent, or Firm*—Fleshner & Kim, LLP

(57) ABSTRACT

Disclosed is an element using a piezoelectric characteristic, and in particular, an SAW filter and a method for manufacturing the same. The SAW filter according to the invention is resistant to input wave of high power by employing ta-C or CNT as an acoustic wave transmission medium. The method for manufacturing the SAW filter according to the invention simplified the manufacturing process and reduced a transmission loss as well noise.

12 Claims, 8 Drawing Sheets

(A) CNT + Forming Complex Film of a Piezoelectric Material (B) Al deposition (evaporation or sputtering)

(C) patterning of Al IDT (lithography)

(D) 'CNT +Piezoelectric Material' or Complex of 'CNT + Insulator'

(A) CNT + Forming Complex Film of a Piezoelectric Material (B) Al deposition
(evaporation or sputtering)

(C) patterning of Al IDT
(lithography)

(D) 'CNT +Piezoelectric Material'
or Complex of 'CNT + Insulator'

SAW FILTER USING A CARBON NANOTUBE AND METHOD FOR MANUFACTURING THE SAME

BACKGROUND OF THE INVENTION

1. Field of the Invention

The present invention relates to a surface acoustic wave (SAW) filter, and in particular, to an SAW filter for high frequency that realized an acute skirt characteristic and resistance to input wave of high power by employing a carbon nanotube (CNT) as an acoustic wave transmitting media of the SAW filter as well as by enlarging the space between electrodes of inter-digital transducers.

The present invention also relates to a method for manufacturing an SAW filter that simplifies a manufacturing process by omitting a surface abrasive process, shortens a manufacturing process, and lowers a manufacturing cost due to the short manufacturing process by using a tetrahedral amorphous carbon (ta-C) as a transmitting medium of the SAW, while facilitating formation of a wide area and reducing transmission loss and noise.

2. Description of the Prior Art

An SAW filter is an element used for removing noise and interference through selective pass of the bandwidth of a particular frequency (center frequency) by using piezoelectric characteristics that are inter-transducible between electricity and machinery. SAW filters are used for core parts of TV, VCR, mobile telecommunications, etc. as bandpass filters.

FIG. 1 is a schematic diagram of an SAW filter in general.

As shown in FIG. 1, the SAW is an element for transducing electric signals to acoustic wave along the surface of a piezoelectric substrate 103 by taking an advantage of a total distortion effect (an inverse piezoelectric effect) of the substrate through installation of two inter-digital transducers IDT 101, 102 on the piezoelectric substrate, and detecting the generated SAW as an electric signal by means of an output transducer.

Here, the IDT comprises a transmitting IDT 101 and a receiving IDT 102. The transmitting IDT 101 transduces the electric signals inputted to a signal generator to an SAW. The transduced SAW progresses along the surface of the piezoelectric substrate 103 so as to be transmitted to the receiving IDT 102.

As a consequence, the receiving IDT 102 transduces the SAW signals to electric signals again by using the piezoelectric effect. Here, the receiving IDT 102 performs a wave filtering so that frequency characteristics can be determined by a geometrical structure of the IDT electrode.

FIG. 2 is a graph illustrating frequency pass characteristics of the SAW filter in general.

As shown in FIG. 2, the SAW filter is set to pass transmitted signals only of a particular frequency, and used as a bandpass filter with set amplitude and phase.

Also, the materials most widely used for a substrate of the SAW filter are LiTaO3 (LTO) and LiNbO3 (LNO), which are mono-crystal materials. However, the SAW filter using such mono-crystal materials cannot be used for high frequency greater than GHz. Therefore, new materials are being developed in a large scale.

Meanwhile, the center frequency of the SAW is proportional to a velocity of the SAW in a transmission medium but inverse proportional to the spacing between the IDT electrodes. Therefore, it is necessary to either use a material of high elasticity or narrow the spacing between the IDT electrodes to heighten the frequency band of the center frequency.

However, there exists a limitation to reduce the spacing between IDTs due to the limitation of patterning technology of IDT electrodes deriving from the limitation of lithography technique as well as to the problems in securing stability and durability against high pressure power. For these reasons, diverse researches are being conducted in a manner of introducing a medium of high elasticity.

Also, in the basic SAW filter, piezoelectric material was a transmitting medium that takes charge of piezoelectric effect and total distortion effect (inverse piezoelectric effect). However, no piezoelectric material of high elasticity has been developed to date in light of the mechanical elastic characteristics of the piezoelectric material. Therefore, new media are being introduced to transmit the SAW.

Outstanding examples of that case are a "piezoelectric material (mainly ZnO)/diamond film" structure, a "piezoelectric material (mainly ZnO)/sapphire" structure, and an "LiNbO3/diamond" structure that have introduced either diamond or sapphire as an SAW medium.

With this introduction, a notably higher transmission velocity (5,200–5,700 m/sec in case of sapphire, and 9,000–11,900 m/sec in case of diamond) than the existing Quartz (3,158 m/sec), LNO (3,488 m/sec) etc. could be achieved. Thus, filters became available in higher frequency band.

While employing diamond for a medium of the SAW has an advantage of availing the SAW filter in high frequency band, however, it also poses the following problems.

First, the process of synthesizing diamond requires high temperature. Also, because of a deflection of the substrate caused by stress of the diamond, it is difficult to realize an area to be greater than 4 inches, for instance.

Further, since the diamond is poly-crystal, a grain boundary exists, thereby increasing the electric wave loss of the signal. Also, despite the need to undergo abrasion of the rough surface of the diamond for use as a medium of the SAW, it is difficult to perform the abrasion process due to hardness of the diamond as well as to consumption of time and expense.

SUMMARY OF THE INVENTION

It is, therefore, an object of the present invention to provide an SAW filter for high frequency that realized an acute skirt characteristic and resistance to input wave of high power as well as to high frequency higher than 2 GHz by employing a carbon nanotube as an acoustic wave transmitting media of the SAW filter by enlarging the space between electrodes of inter-digital transducers.

To achieve the above object, there is provided an SAW filter according to one aspect of the present invention, comprising: a substrate; a complex film composed of CNT and a piezoelectric material, and having a piezoelectric characteristic so as to transmit SAW; and IDTs for outputting electric signals by receiving the SAW from the complex film.

There is also provided a method for manufacturing an SAW filter, comprising the steps of: forming a complex film on a substrate; forming a conductive material on the complex film; and patterning the conductive material.

Here, the complex film is formed either of CNT and a piezoelectric material or of a complex comprised of CNT and an insulator and a piezoelectric material formed on the complex.

The method for forming the complex film according to one aspect of the present invention comprises the steps of: forming catalyst patterns by means of a lithography technique used in an ordinary semiconductor process; growing a CNT bridge in horizontal direction between the catalyst patterns; and forming a piezoelectric material on the grown CNT bridge by sputtering.

The method for forming the complex film according to another aspect of the present invention comprises the steps of: forming suspension by dispersing the CNT into a predetermined solution; attaching the CNT suspension to the substrate by means of electromagnetic field or electrostatic force; and forming a piezoelectric material on the substrate, to which the CNT suspension has been attached, by sputtering.

The method for forming the complex film according to another aspect of the present invention comprises the steps of: forming suspension by dispersing the CNT into a predetermined solution; precipitating the CNT suspension by filtering through a filter membrane; and forming a piezoelectric material on the substrate, in which the CNT has been precipitated, by sputtering.

In the process of filtering the CNT suspension through the filter membrane, the CNT suspension is aligned by means of magnetic field.

There is also provided a SAW filter according to another aspect of the present invention, comprising: a substrate; an acoustic wave transmission medium of SAW composed of tetrahedral amorphous carbon and formed on the substrate so as to transmit SAW; a piezoelectric material having piezoelectric characteristics and formed tightly onto the SAW; and IDTs for generating SAW by transmitting inputted electric signals to the piezoelectric material, and outputting the electric signals by receiving the SAW from the piezoelectric material.

Here, the acoustic wave transmission medium of the tetrahedral amorphous carbon formed on the substrate is deposited by arc discharging with respect to black lead. The acoustic wave transmission medium of the tetrahedral amorphous carbon formed on the substrate has a thickness less than 1 $\mu$m.

The acoustic wave transmission medium of the tetrahedral amorphous carbon formed on the substrate is deposited by laser ablation using black lead.

Thus, the present invention described as above can provide an SAW filter for high frequency that has an acute skirt characteristic and is resistant to an input wave of high power by employing a CNT as an acoustic wave transmission medium of the SAW filter and by enlarging the space between electrodes of inter-digital transducers.

The present invention relates to an SAW filter employing a CNT (having an elasticity of 1.8 Tpa), which is known to be a material of highest elasticity as an acoustic material of the SAW filter. The CNT can be produced to have a variety of elasticity depending on the structure and diameter thereof.

BRIEF DESCRIPTION OF THE DRAWINGS

The above and other objects, features and advantages of the present invention will become more apparent from the following detailed description when taken in conjunction with the accompanying drawings, in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1:
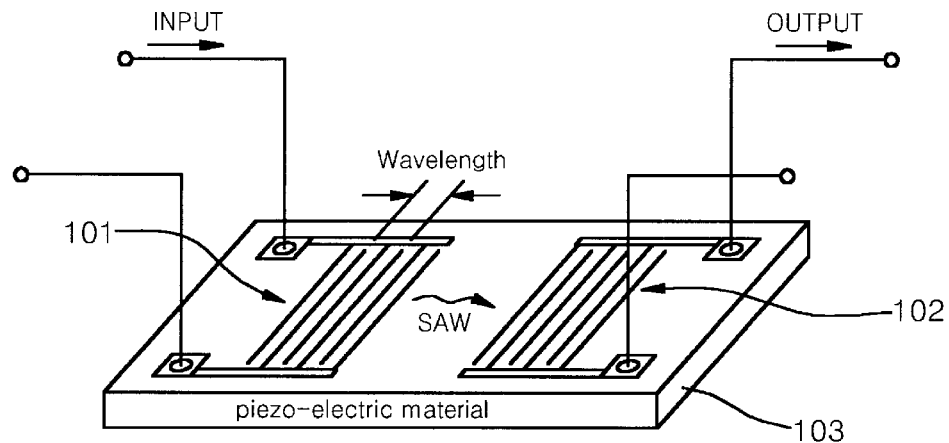
FIG. 1 is a schematic diagram of an SAW filter in general.
Figure 2:
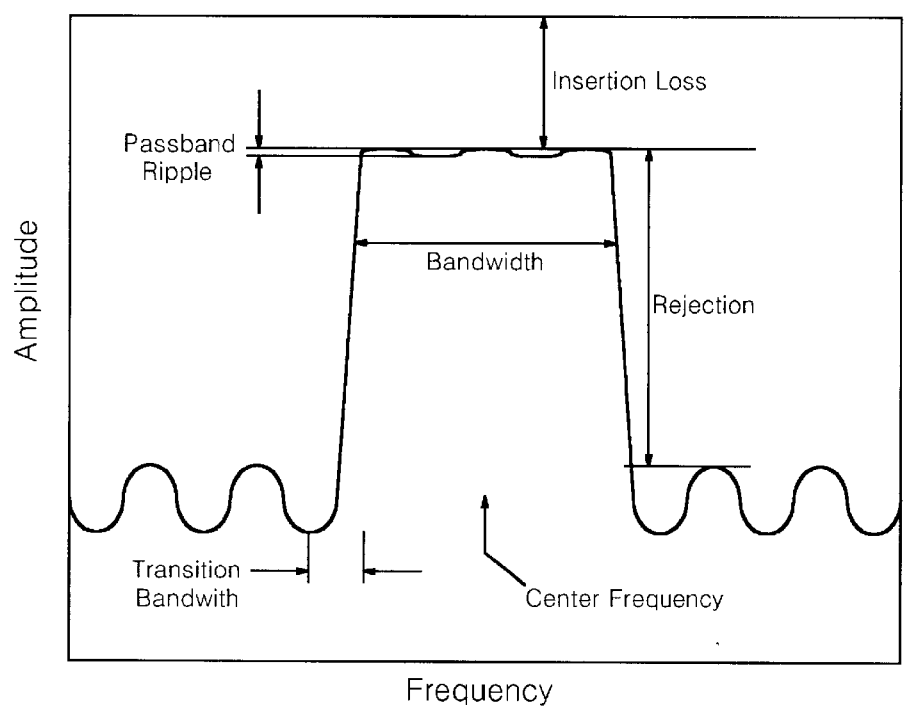
FIG. 2 is a graph illustrating frequency pass characteristics of the SAW filter in general.
Figure 3:
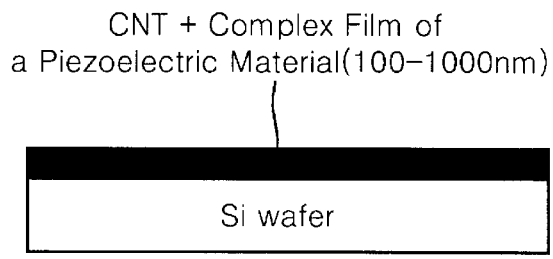
FIG. 3 is a schematic diagram illustrating a process of manufacturing an SAW filter by using a CNT according to the present invention.
Figure 3:
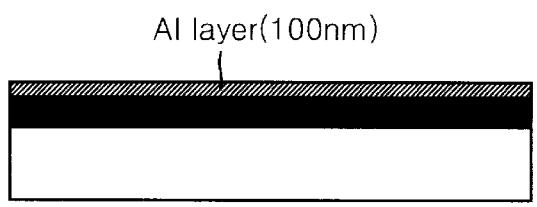
Figure 3:
Figure 3:
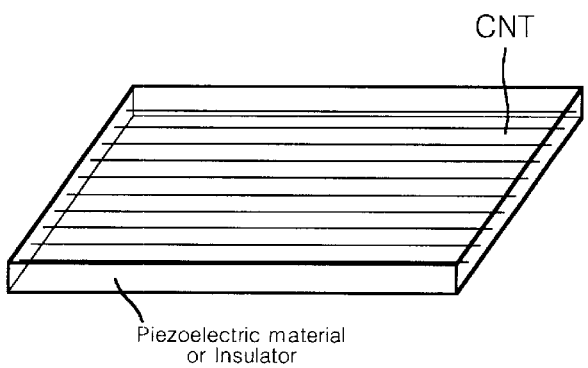
Figure 4A:
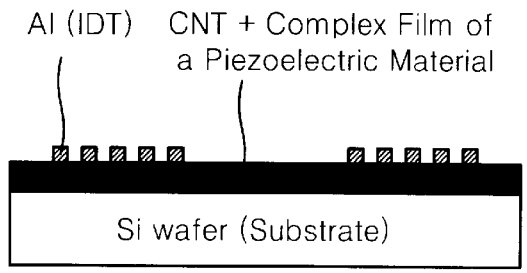
FIGS. 4A–4D are schematic diagrams exemplifying a variety of structures of an SAW filter using a CNT according to the present invention.
Figure 4B:
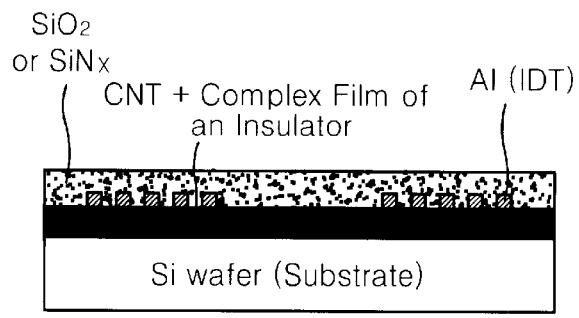
Figure 4C:
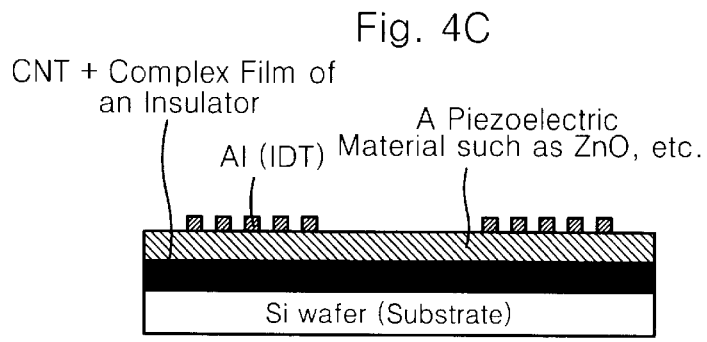
Figure 4D:
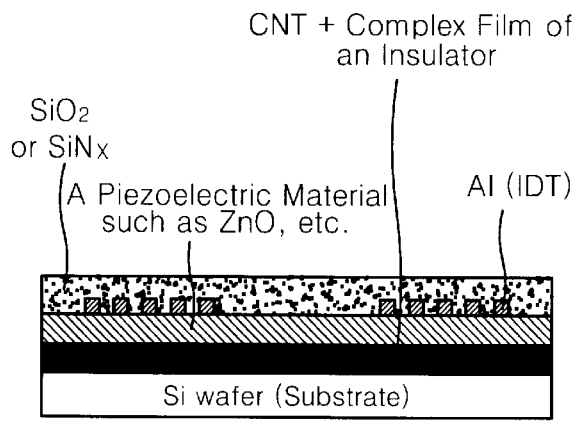

FIG. 3 is a schematic diagram illustrating a process of manufacturing an SAW filter using a CNT according to the present invention.

Referring to FIG. 3, the SAW filter using a CNT according to the present invention forms a film composed of "a complex of a CNT and a piezoelectric material" on a silicon substrate at a thickness ranged 0.1–1 $\mu$m, for example, as shown in FIG. 3(A).

As shown in FIG. 3(B), Al is formed on the complex film by means of evaporation or sputtering to form IDT electrodes. Also, IDT electrodes having an appropriate shape are formed by means of lithography as shown in FIG. 3(C).

If necessary, silicon oxide or silicon nitride is provided for the element formed as shown in FIG. 3(C). Here, silicon oxide or silicon nitride serves to heighten or lower the central frequency as well as to enhance temperature resistance of the element. Further, the silicon oxide or silicon nitride has advantages of electric insulation and easy transportation of the element.

Meanwhile, the structure of the SAW filter according to a preferred embodiment of the present invention is variable into diverse shapes as shown in FIG. 4. FIG. 4 is a schematic diagram exemplifying a variety of structures of an SAW filter using a CNT according to the present invention.

According to a varied embodiment of the present invention, the IDT electrodes are shielded, if necessary, and a piezoelectric material such as ZnO is formed as a separate layer. Also, it is obvious that employing the CNT as an acoustic material is applicable to the SAW filter of many known structures.

Meanwhile, in order to manufacture an SAW filter by using the CNT as an acoustic material, it is important to transduce the CNT to be used as an acoustic material to a sequential elastic medium. Here, a complex of the CNT and the piezoelectric material or a complex of the CNT and an insulator may be used for the SAW filter. The following is a description of the methods for manufacturing a CNT having a sequential elastic medium.

The first method is to manufacture a CNT bridge by means of in-situ in catalyst patterns produced by an ordinary semiconductor process.

This method uses a lithography technique commonly used in the silicon semiconductor process to form catalyst patterns as shown in FIG. 5. A CNT bridge is grown in horizontal direction between the catalyst patterns. FIG. 5 is a diagram illustrating a process of horizontally growing a CNT between catalyst patterns to manufacture an SAW filter by using the CNT.

Figure 5A:
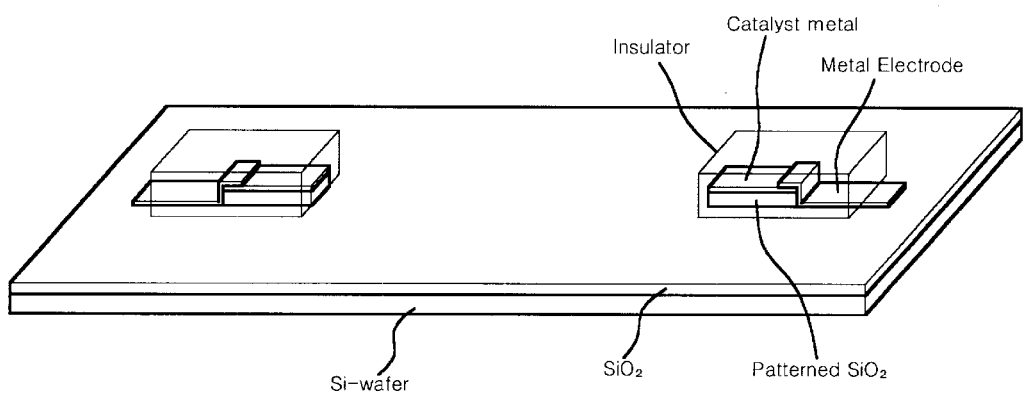
FIGS. 5A and 5B are diagrams illustrating a process of horizontally growing a CNT between catalyst patterns to manufacture an SAW filter by using the CNT.
Figure 5B:
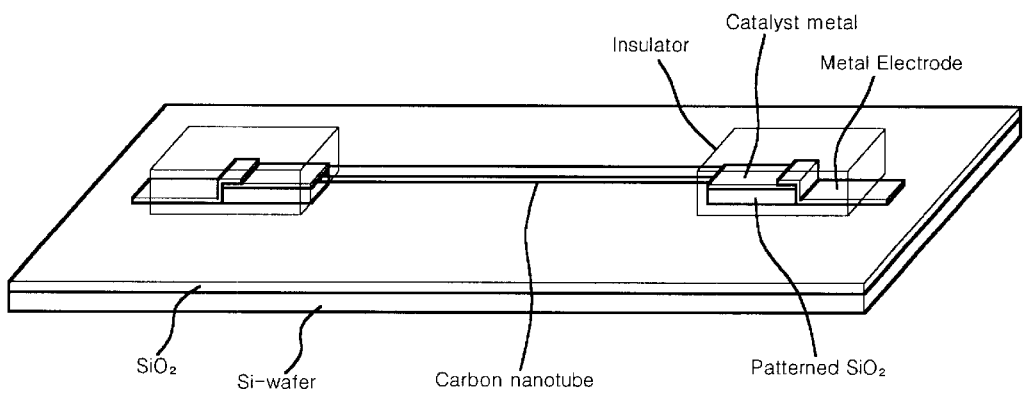

The CNT is grown in a row in horizontal direction, as shown in FIG. 5(B), between the pre-manufactured catalyst patterns, as shown in FIG. 5(A). A piezoelectric material such as ZnO or PZT is formed thereon by sputtering so as to be used for an SAW filter.

Another available method in addition to the method for forming a film composed of a complex of the CNT and the piezoelectric material is to first form a complex of the CNT and the insulator and to form a piezoelectric material thereon.

When forming a complex of the piezoelectric material, a mechanical connection between the CNT and the piezoelectric material is very important. If the mechanical connection between the CNT and the piezoelectric material is unstable, the acoustic wave is not effectively transmitted from the piezoelectric material.

The complex of the CNT and the piezoelectric material manufactured through the above process is formed as shown in FIG. 3(D). In that case, an Al electrode needs to be formed on the complex. Thus, the surface of the complex, on which the electrode is to be formed, should maintain electric insulation, and it can be realized by sputtering the piezoelectric material to have a thickness sufficient for electric insulation.

The second method is to use the CNT powder.

Here, this method will be referred to as "a CNT powder suspension method" for convenience sake. According to the method, the CNT powder dispersed in the solution is adsorbed by electric force comprising electrostatic force (Coulomb force) or electric field. This method is a method of attaching a suspension formed by mixing the CNT powder, which has been produced by an electric arc discharge, a laser evaporation or CVD, etc., with sodium dodecyl sulfate (SDS) or lithium dodecyl sulfate (LDS), and by dispersing the same by using 'an electrophoresis', which uses electric force, or 'a self-assembly', which uses an electrostatic force with a chemical functional group, to a desired location.

The preferred embodiment of the present invention uses an LDS solution or an SDS solution of 1 weight % as an aqueous solution. The solution was oscillated for two minutes by an ultrasonic oscillating device. If a silicon wafer is dipped into the solution and taken out thereof, a CNT is attached to the silicon substrate.

In case of a self-assembly, the silicon substrate is dipped into a solution of 2.5 mM/liter 3-aminopropyltriethoxysilane (APS) for 15 minutes under a room temperature. This is a process of producing an amino group, which has been charged with positive ions on the substrate.

The amino group charged with positive ions generates an electrostatic force with a sulfate group charged with negative ions, which is adsorbed onto the CNT, so that the CNT can be attached to the substrate. Here, the amount of CNT attached to the substrate is proportional to concentration and time. A sulfactant attached to the substrate can be detached therefrom by lightly rinsing with pure water and drying.

In case of the electrophoresis, desired metal patterns are formed on the $SiO_2$ substrate, and the CNT charged with negative ions by the electric force due to a positive voltage is drawn and attached to the substrate.

A piezoelectric/elastic material structure can be manufactured by sputtering a piezoelectric material on the substrate, to which the CNT has been attached. An SAW filter can be manufactured by forming Al IDTs thereon.

If necessary, insulation film such as silicon oxide or silicon nitride can further be formed as shown in FIG. 4. The effects of the silicon oxide lie in lowering the center frequency and securing stability against temperature, while those of the silicon nitride lie in heightening the center frequency and resistance against humidity.

The third method is a method of manufacturing a bucky paper well aligned in one direction by aligning the CNT powder with external magnetic field.

The basic manufacturing principle is to precipitate the CNT suspension of a liquid state into a nylon filter membrane. If satisfactory, a variety of filters may be used instead of nylon.

A method use for manufacturing a bucky paper through precipitation is to forcibly stream the suspension to heighten the manufacturing velocity. For example, if a tube of a cylindrical shape is prepared as shown in FIG. 6, and a filter membrane is installed perpendicular to a tube axis while streaming the water flow in the direction parallel to the tube axis, the bucky paper can be manufactured faster than the flow velocity.

Figure 6:
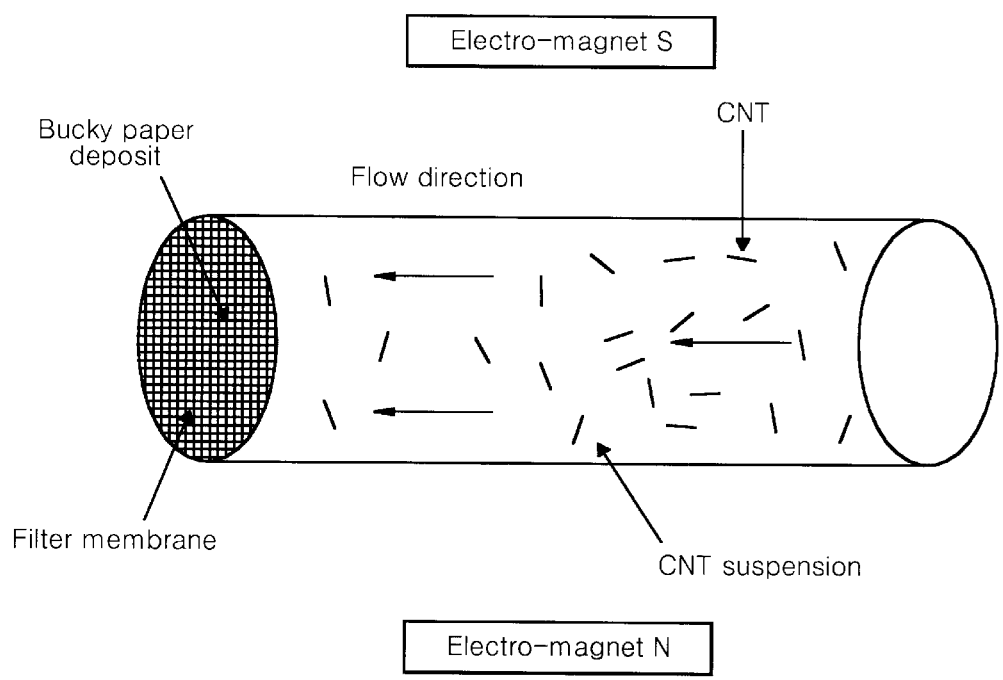
FIG. 6 is a diagram illustrating a process of manufacturing a bucky paper of the CNT aligned in an axial direction by using magnetic field to manufacture an SAW filter using the CNT according to the present invention.

FIG. 6 is a diagram illustrating a process of manufacturing a bucky paper of the CNT aligned in an axial direction by using magnetic field to manufacture an SAW filter using the CNT according to the present invention.

Here, the flow direction may be variable to be in tube axial direction or radial direction. It is possible to obtain a bucky paper well aligned in one direction by bridging strong magnetic field from outside.

For instance, the CNT is aligned in the magnetic field direction due to the catalyst metal of strong magnetic force included in the CNT if strong magnetic field of 25 tesla is bridged from outside to be perpendicular to the tube axis and the above process is performed.

As described above, the SAW filter using a CNT according to the present invention realized an SAW filter that is useful for high frequency, has an acute skirt characteristic, and is resistant to input wave of high power by employing a carbon nanotube (CNT) as an acoustic wave transmitting media of the SAW filter and by enlarging the space between electrodes of inter-digital transducers.

Further, the SAW filter using a CNT can ignore bulk acoustic wave progressing into a substrate because of a slim thickness thereof. Thus, the SAW filter using a CNT has advantageous effects of reducing loss and noise caused by bulk acoustic wave.

FIG. 7 is a diagram illustrating a process of manufacturing an SAW filter by using tetrahedral amorphous carbon according to the present invention.

Referring to FIG. 7, the SAW using tetrahedral amorphous carbon (ta-C) according to the present invention is manufactured by the following process. First, the ta-C is deposited on a silicon substrate at a thickness ranged 0.1–1 $\mu$m, for instance, by means of direct current arc discharging, as shown in FIG. 7(A).

Figure 7A:
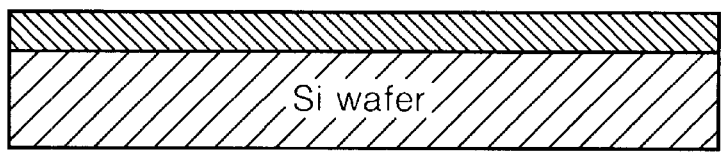
FIGS. 7A–7D are diagrams illustrating a process of manufacturing an SAW filter by using tetrahedral amorphous carbon according to the present invention.
Figure 7B:
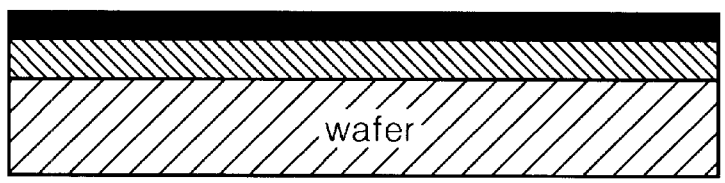
Figure 7C:
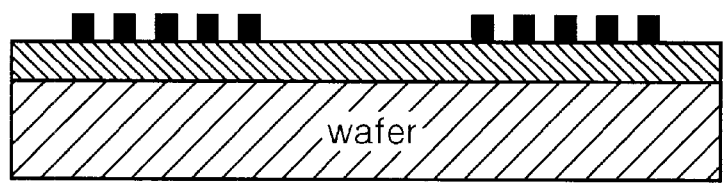

As a next step, as shown in FIG. 7(B), Al is formed on a ta-C film by means of evaporation or sputtering to form IDT electrodes. Also, IDT electrodes of an appropriate shape are formed by means of lithography as shown in FIG. 7(C).

Figure 7D:
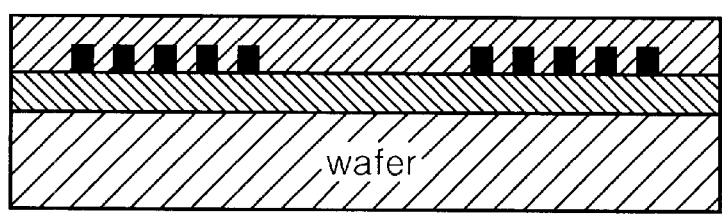
Figure 8A:
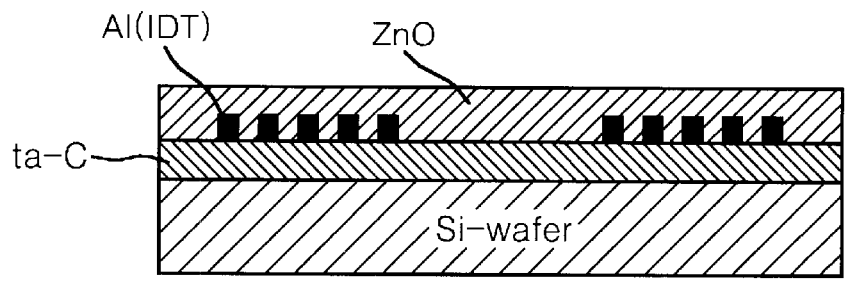
FIGS. 8A–8D are schematic diagrams exemplifying a variety of structures of an SAW filter using tetrahedral amorphous carbon according to the present invention.
Figure 8B:
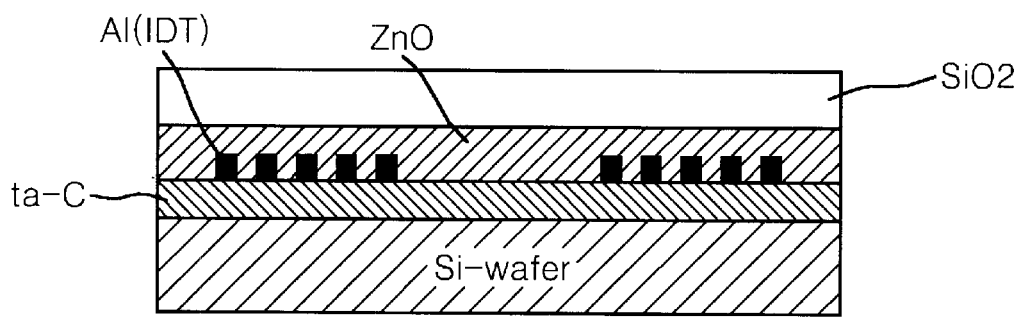
Figure 8C:
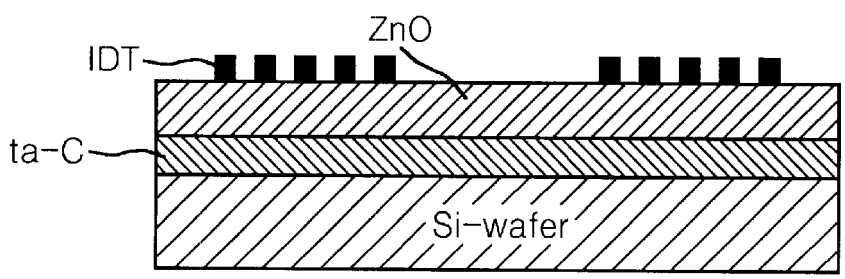
Figure 8D:
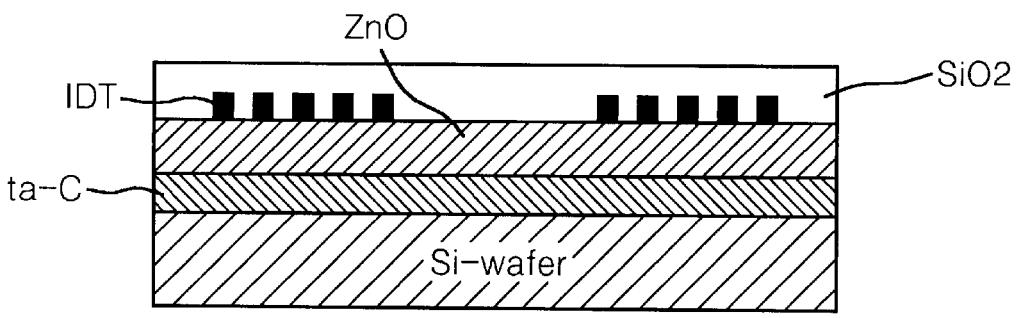

As shown in FIG. 7(D), a ZnO film, which is a piezoelectric material, is formed to have a thickness ranged 0.3–2.5 $\mu$m, for instance. A SAW filter using the ta-C as an SAW transmission medium can be manufactured in this manner.

Meanwhile, the structure of the SAW filter as described with reference to an embodiment of the present invention is variable into diverse structures as shown in FIG. 8. FIG. 8 is a schematic diagram exemplifying a variety of structures of an SAW filter using tetrahedral amorphous carbon according to the present invention.

According to a modified embodiment of the present invention, the IDT electrodes are shielded or a surface of the ZnO film undergoes hardening abrasion. Also, it is obvious that employing the ta-C as an acoustic wave transmission medium is applicable to the SAW filter of various structures that have been well known, though not illustrated in FIG. 8.

The ta-C employed as an acoustic wave transmission medium according to the present invention is a kind of diamond-like carbon (DLC), but is a novel material having a 85% elasticity of a mono-crystal diamond. Such a high elasticity is attributable to the fact that more than 85% of carbonic composition within the material is comprised of SP3 composition.

Figure 9:
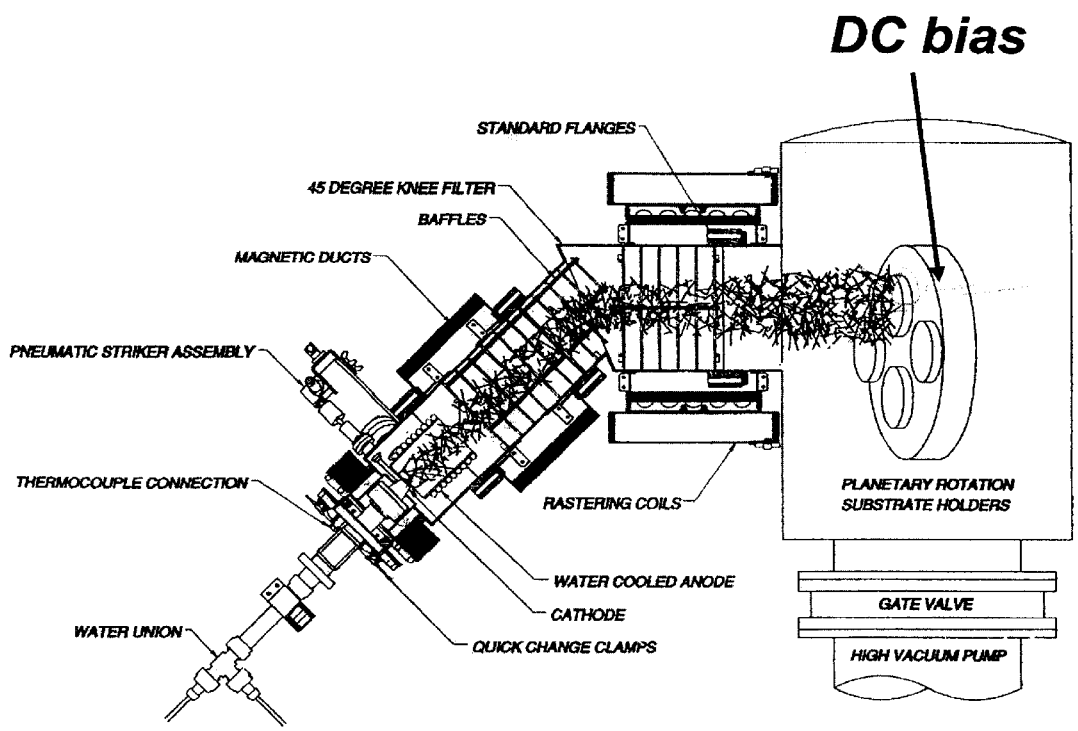
FIG. 9 is a schematic view of a deposition apparatus for depositing the tetrahedral amorphous carbon in manufacturing an SAW using the tetrahedral amorphous carbon according to the present invention.

FIG. 9 is a schematic view of a deposition apparatus for depositing the tetrahedral amorphous carbon in manufacturing an SAW using the tetrahedral amorphous carbon according to the present invention. The following is a brief description of a process of depositing the ta-C on the substrate made with reference to FIG. 9.

A black lead target was used as a carbon source in the embodiment of the present invention. Also used were substrate bias direct current and HF, RF, etc. for arc discharge. In case of the direct current, a voltage of –100V was applied to adjust a kinetic energy of carbon ions to be ranged 100–125 eV. In case of HF or RF, however, a self-bias value was controlled to be within the same range.

Also, the substrate was cleaned by using Ar ion for 30 seconds to 5 minutes. The substrate was water-cooled and rotated for uniform coating. For uniform coating of the area, arc beam raster was performed in horizontal and vertical directions. The raster frequency was set to be 50–60 Hz in horizontal direction and 2–16 Hz in vertical direction.

Also, the degree of vacuum before arc deposition was to be 10–7 torr, while the degree of vacuum during arc deposition was to be 10–3 or 10–4 torr.

Another available method in addition to the method using arc discharge is a deposition using laser ablation. However, the method using arc discharge is much simpler in manufacturing the SAW filter with respect to area.

On the other hand, the SAW filter using ta-C as an SAW medium has the following advantages.

First, the process of manufacturing an SAW filter by using the ta-C does not require so high temperature as in the diamond synthesizing process. This process also has a merit of undergoing a simple process not requiring so long period of time as the mono-crystal growing process such as LNO or LTO.

Further, in the diamond synthesizing process, it is difficult to realize a wide area wider than 4 inches due to a bending of the substrate caused by a stress. In case of a mono-crystal, actual production is made in 3 inches, although researches have been completed for 4 inches. However, using the ta-C coating enables manufacture of mono-crystals up to 9 inches. Further, laying out of Arc enables uniform coating up to 30 cm *30 cm. It is also possible to manufacture the mono-crystals wider than 30 cm *30 cm.

Also, attachment of a sputtering device to vacuum arc deposition equipment enables sputtering of a piezoelectric material or an Al electrode, thereby serving to simplify the process. A diamond, which is a poly-crystal, requires a post-abrasion. On the other hand, ta-C coating results in a very smooth surface composed of atoms having a a root mean square (RMS) surface luminance of about 5 Å, thereby requiring no post-abrasion process.

Also, ta-C is chemically very stable and highly adhesive with the substrate.

Meanwhile, most of the SAW filters have a resistance up to 3.5W due to a spacing between IDT electrodes. The preferred embodiment of the present invention used a material of high elasticity, and a transmission velocity of SAW is fairly high. Therefore, when the desired center frequency is the same, the spacing between IDT electrodes can be widened. For instance, assuming that other conditions are the same, the IDT electrodes may be spaced twice wider than mono-crystals of LNO or LTO. Those electrodes are resistant to higher input power.

Therefore, the present invention has an advantage of lowering the manufacturing cost due to the process that is simple and requires temperature lower than 200° C.

The ta-C SAW filter manufactured by the above method has a center frequency of about 2.3 GHz when the wavelength is 4 $\mu$m, i.e., when the spacing between the IDT electrodes is 2 $\mu$m and the IDT finger width is 0.9 $\mu$m. The insertion loss was low to be about 10 dB, while the SAW transmission velocity was ranged 8,500–9,000 m/sec. The electro-mechanic combination coefficient was about 1.4%, while the Q value was about 600. The frequency deviation was merely about 1,000 ppm within the temperature ranged –40° C.–85° C.

As described above, the SAW filter using tetrahedral amorphous carbon according to the present invention has advantageous effects of simplifying the manufacturing process dispensing with a surface abrasion process by employing tetrahedral amorphous carbon as an SAW transmission medium as well as of lowering the manufacturing cost and facilitating formation of a wide area while reducing the transmission loss and noise.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A surface acoustic wave (SAW) filter using a carbon nanotube (CNT) as an acoustic wave transmitting media of the SAW, to which a piezoelectric and an inverse piezoelectric principle are applicable.

2. The SAW filter of claim 1, comprising:
   a substrate having a complex film, to which the CNT and a piezoelectric material have been added, for transmitting the SAW; and
   inter-digital transducers (IDT) for generating SAW by transmitting inputted electric signals to the complex film, and outputting the electric signals by receiving the SAW from the complex film.

3. A method for manufacturing a surface acoustic wave (SAW) filter, comprising:

forming a complex film including a carbon nanotube (CNT);

forming a conductive film on the complex film; and patterning the conductive film.

4. The method of claim 3, wherein the complex film comprises a CNT and a piezoelectric material.

5. The method of claim 3, wherein the complex film comprises a CNT and an insulator.

6. The method of claim 3, wherein the forming of the complex film comprises:

forming catalyst patterns by means of a lithography technique used in an ordinary semiconductor process;

growing a CNT bridge between the formed catalyst patterns in horizontal direction; and forming a piezoelectric material on the CNT bridge by means of sputtering.

7. The method of claim 3, wherein the forming of the complex film comprises:

forming a suspension by dispersing the CNT into a predetermined solution;

attaching the CNT suspension to the substrate by means of electromagnetic force; and forming a piezoelectric material on the substrate, to which the CNT has been attached, by means of sputtering.

8. The method of claim 3, wherein the conductive film is Al.

9. The method of claim 3, wherein the forming of the complex film comprises:

forming a suspension by dispersing the CNT into a predetermined solution;

precipitating the CNT suspension by filtering the same through a filter membrane; and forming a piezoelectric material on the substrate, on which the CNT has been precipitated, by means of sputtering.

10. The method of claim 9, wherein the filtering of the CNT suspension is performed by aligning the CNT suspension by means of magnetic field.

11. A surface acoustic wave (SAW) filter made by the method of claim 3.

12. The method of claim 3, wherein forming the complex film comprises forming the complex film on a substrate.

* * * * *